(12) United States Patent
Scott et al.

(10) Patent No.: US 9,340,854 B2
(45) Date of Patent: May 17, 2016

(54) DOWNHOLE MOTOR WITH DIAMOND-LIKE CARBON COATING ON STATOR AND/OR ROTOR AND METHOD OF MAKING SAID DOWNHOLE MOTOR

(75) Inventors: Dan E. Scott, Montgomery, TX (US); Chih Lin, Huntsville, TX (US)

(73) Assignee: BAKER HUGHES INCORPORATED, Houston, TX (US)

(*) Notice: Subject to any disclaimer, the term of this patent is extended or adjusted under 35 U.S.C. 154(b) by 608 days.

(21) Appl. No.: 13/182,212

(22) Filed: Jul. 13, 2011

(65) Prior Publication Data
US 2013/0014995 A1   Jan. 17, 2013

(51) Int. Cl.
| | |
|---|---|
| E21B 7/00 | (2006.01) |
| C22C 26/00 | (2006.01) |
| E21B 4/02 | (2006.01) |
| F01C 1/10 | (2006.01) |
| C23C 16/04 | (2006.01) |
| C23C 16/26 | (2006.01) |
| C23C 16/455 | (2006.01) |

(52) U.S. Cl.
CPC ............... *C22C 26/00* (2013.01); *C23C 16/045* (2013.01); *C23C 16/26* (2013.01); *C23C 16/45578* (2013.01); *E21B 4/02* (2013.01); *F01C 1/101* (2013.01); *F04C 2230/91* (2013.01); *F05C 2203/0808* (2013.01); *F05C 2251/10* (2013.01); *F05C 2253/08* (2013.01); *Y10T 29/49229* (2015.01)

(58) Field of Classification Search
USPC ............. 427/249.7, 249.8; 417/228; 175/324, 175/323, 320, 92
See application file for complete search history.

(56) References Cited

U.S. PATENT DOCUMENTS

| | | | | |
|---|---|---|---|---|
| 4,486,286 | A | * | 12/1984 | Lewin et al. ............. 204/192.11 |
| 5,171,138 | A | * | 12/1992 | Forrest ............................. 418/48 |
| 5,395,221 | A | | 3/1995 | Tucker, Jr. et al. |
| 5,593,719 | A | * | 1/1997 | Dearnaley et al. ........... 427/2.26 |
| 5,599,144 | A | * | 2/1997 | Bickham et al. ............... 408/144 |
| 5,985,451 | A | * | 11/1999 | Senda et al. ................... 428/408 |
| 6,338,901 | B1 | * | 1/2002 | Veerasamy ................... 428/408 |
| 6,604,922 | B1 | | 8/2003 | Hache |
| 7,118,782 | B2 | | 10/2006 | Regel et al. |
| 7,160,616 | B2 | * | 1/2007 | Massler et al. ................ 428/408 |
| 8,021,721 | B2 | | 9/2011 | Griffo |
| 8,029,875 | B2 | | 10/2011 | Wei et al. |
| 2004/0031625 | A1 | * | 2/2004 | Lin et al. ........................ 175/371 |
| 2007/0172371 | A1 | * | 7/2007 | Podmore ......................... 418/48 |
| 2008/0236842 | A1 | * | 10/2008 | Bhavsar et al. ............... 166/381 |
| 2010/0038142 | A1 | | 2/2010 | Snyder et al. |
| 2010/0044110 | A1 | | 2/2010 | Bangru et al. |
| 2010/0108393 | A1 | | 5/2010 | John et al. |
| 2010/0206553 | A1 | | 8/2010 | Bailey et al. |
| 2010/0226759 | A1 | * | 9/2010 | Cooley et al. ............... 415/170.1 |
| 2011/0042069 | A1 | * | 2/2011 | Bailey et al. ................ 166/244.1 |

OTHER PUBLICATIONS

International Search Report and Written Opinion dated Jan. 29, 2013 for International Application No. PCT/US2012/046144.

* cited by examiner

*Primary Examiner* — Giovanna C Wright
*Assistant Examiner* — Ronald Runyan
(74) *Attorney, Agent, or Firm* — Cantor Colburn LLP

(57) ABSTRACT

A drilling motor and method of making a drill motor are disclosed. The drilling motor includes a stator having a bore therethrough and inner surface and a rotor having an outer surface configured to be disposed in the stator. The outer surface of the rotor comes in contact with the inner surface of the stator. At least one of the inner surface of the stator and the outer surface of the rotor includes a coating of a diamond-like carbon material.

10 Claims, 2 Drawing Sheets

DOWNHOLE MOTOR WITH DIAMOND-LIKE CARBON COATING ON STATOR AND/OR ROTOR AND METHOD OF MAKING SAID DOWNHOLE MOTOR

BACKGROUND INFORMATION

1. Field of the Disclosure

This disclosure relates generally to drilling motors for use in drilling of wellbores.

2. Brief Description of the Related Art

To obtain hydrocarbons, such as oil and gas, boreholes or wellbores are drilled by rotating a drill bit attached to a drill string end. A substantial proportion of the current drilling activity involves drilling deviated and horizontal boreholes to increase the hydrocarbon production and/or to withdraw additional hydrocarbons from the earth's formations. Modern directional drilling systems generally employ a drill string having a drill bit at the bottom that is rotated by a positive displacement motor (commonly referred to as a "mud motor" or a "drilling motor"). A typical mud motor includes a power section that contains a stator and a rotor disposed in the stator. The stator typically includes a metal housing lined inside with a helically contoured or lobed elastomeric material. The rotor is typically made from a suitable metal, such as steel, and has an outer lobed surface. Some mud motors include a metallic stator and a metallic rotor. Pressurized drilling fluid (commonly known as the "mud" or "drilling fluid") is pumped into a progressive cavity formed between the rotor and stator lobes. The force of the pressurized fluid pumped into the cavity causes the rotor to turn in a planetary-type motion. In the metal stator and metal rotor mud motor, a clearance is designed between the rotor and stator to allow assembly of the mud motor. The friction between the elastomeric stator and the metallic rotor results in loss of efficiency of the motor.

The disclosure herein provides drilling motors that include stators and/or rotors with a coating of a diamond-like carbon material.

SUMMARY

In one aspect, a drilling motor is provided that in one embodiment includes a stator having a bore therethrough and inner surface and a rotor having an outer surface configured to be disposed in the stator, wherein the outer surface of the rotor comes in contact with the inner surface of the stator, and wherein the inner surface of the stator and/or the outer surface of the rotor include a coating of a diamond-like carbon material.

In another aspect, a method of making a mud motor is provided that in one embodiment includes: providing a stator having a bore therethrough and inner surface; providing a rotor configured to be disposed in the stator; coating the inner surface of the stator and/or the outer surface of the rotor with a diamond-like carbon material of a selected thickness; and placing the rotor inside the stator to make the drilling motor.

Examples of certain features of the apparatus and method disclosed herein are summarized rather broadly in order that the detailed description thereof that follows may be better understood. There are, of course, additional features of the apparatus and method disclosed hereinafter that will form the subject of the claims appended hereto.

BRIEF DESCRIPTION OF THE DRAWINGS

For detailed understanding of the present disclosure, references should be made to the following detailed description, taken in conjunction with the accompanying drawings in which like elements have generally been designated with like numerals and wherein.

DESCRIPTION OF THE EMBODIMENTS

Figure 1:
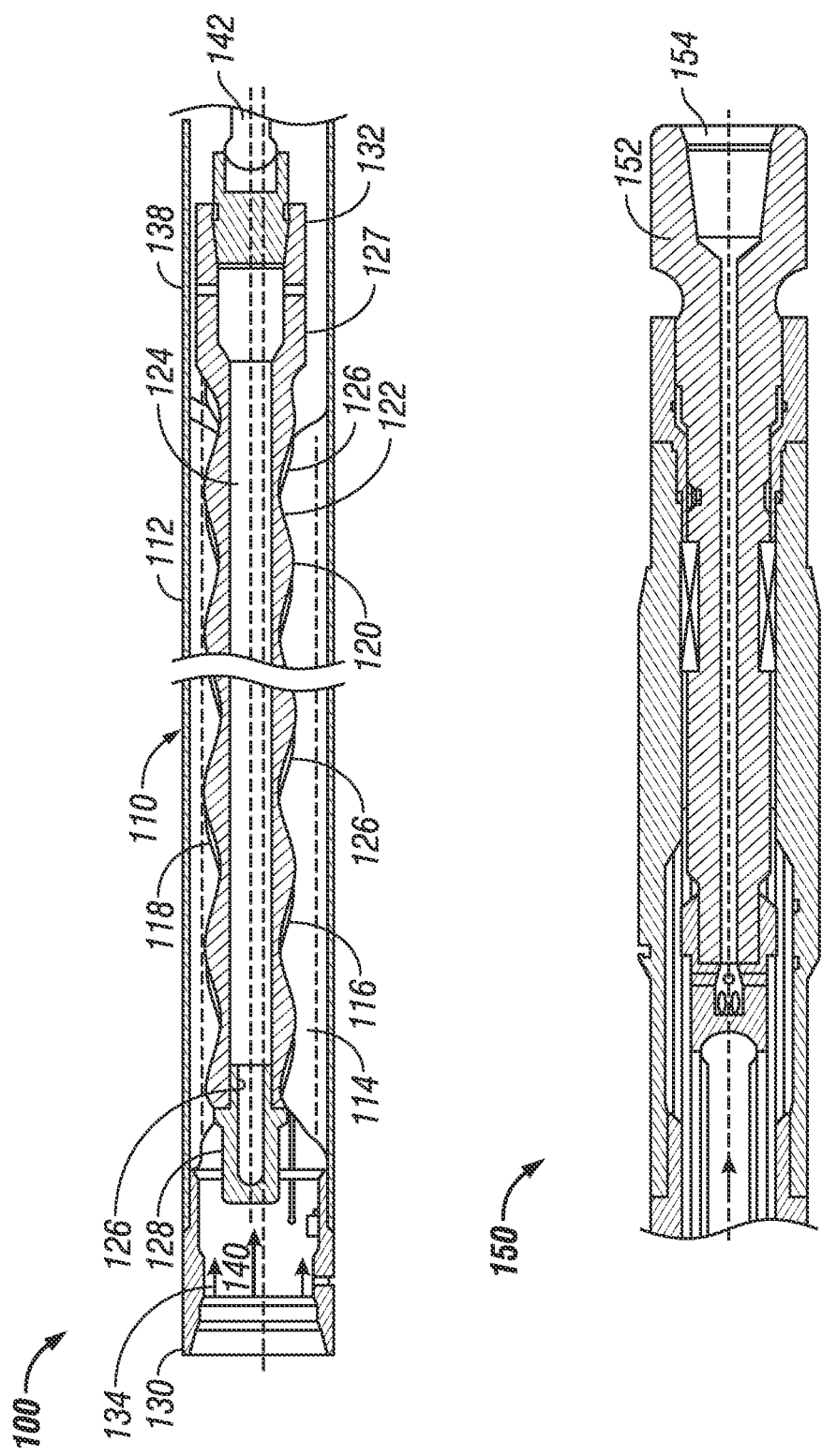
FIG. 1 shows an exemplary mud motor that includes a diamond-like carbon material coating on the inner surface of the stator and/or on the outer surface of the rotor made according to an embodiment disclosed herein.

FIG. 1 shows a cross-section of an exemplary drilling motor 100 that includes a rotor made according to an embodiment of the disclosure. The drilling motor 100 includes a power section 110 and a bearing assembly 150. The power section 110 contains an elongated metal housing 112 having therein an elastomeric stator 114 that includes lobes 118. The stator 114 is secured inside the housing 112 or formed integral with the housing 112. A rotor 120 made of a suitable metal or an alloy includes lobes 122. The rotor 120 is rotatably disposed inside the stator 114. The stator 114 includes one lobe more than the number of rotor lobes. In aspects, the rotor 120 may have a bore 124 that terminates at a location 127 below the upper end 128 of the rotor 120 as shown in FIG. 1. The bore 124 remains in fluid communication with the drilling mud 140 below the rotor 120 via a port 138. The rotor lobes 122 and the stator lobes 118 and their helical angles are such that the rotor 120 and the stator 114 seal at discrete intervals, resulting in the creation of axial fluid chambers or cavities 126 that are filled by the pressurized drilling fluid or mud 140 when such fluid is supplied to the motor 100 from the surface during drilling of a wellbore. The pressurized drilling fluid 140 flowing from the top 130 of the motor 100 to the bottom 132 of the power section 110, as shown by arrow 134, causes the rotor 120 to rotate within the stator 114. The design and number of the lobes 118 and 122 define the output characteristics of the motor 100. In one configuration, the rotor 120 is coupled to a flexible shaft 142 that connects to a rotatable drill shaft 152 in the bearing assembly 150 that carries a drill bit (not shown) in a suitable bit box 154. During a drilling operation, the pressurized fluid 140 rotates the rotor 120 that in turn rotates the flexible shaft 142. The flexible shaft 142 rotates the rotatable drill shaft 152, which in turn rotates the bit box 154 and thus the drill bit. During operation, the metallic rotor comes in contact with the elastomeric stator. The friction between the rotor and the elastomeric rotor reduces the efficiency of the motor 100. In the exemplary mud motor 100 shown in FIG. 1, the surface of the elastomeric material and/or the outer surface of the rotor 120 are coated with a diamond-like carbon material to improve tribology of the rotor and/or stator performance, for example reduced friction, reduced wear and increased lubricity of stator and/or rotor.

Diamond-like carbon materials include a material referred to as SP3 that is the diamond form of carbon having a crystalline structure. Another material, referred to as SP2 has a graphite structure. A mixture of SP3 and SP2 has been utilized to coat components and materials. The amount of the diamond-like carbon material by weight generally varies from 50% to 70%. The thickness of such coatings typically is between 1 and 15 microns. The inventors have determined that a high SP3 bond carbon content (often greater than 70%) coating on a substrate provides a layer of low friction and is highly resistant to acidic and alkali environment, such as salt water present in wellbores, thus enhancing both the physical characteristic and chemical resistance to the substrate. The inventors have further determined that about 90% SP3 bond carbon content coating provides desirable results for downhole applications. Such coatings provide improved performance and operating life in downhole tools. Wellbore temperatures often exceed 150 degrees Celsius and the downhole pressure often exceeds 10,000 psi. In various embodiments, the diamond-like carbon material coating contains about 99 percent SP3 bond carbon. The Inventors also have discovered that coating thickness greater than 15 microns and particularly in the range of 20 to 100 microns is more reliable than coating between for downhole environment. In addition, materials with high SP3 bond carbon content (relative to other forms of carbon hybridization) can be applied at relatively low temperature (about 100 degree Celsius) to components, such as elastomeric stators and metallic rotors of a drilling motor. Such relatively thick diamond-like carbon material coatings applied to components like elastomers of stators provide high flexural strength, which is a desired property for drilling motors. Lower friction of the elastomer of the stator coated with a high content diamond-like carbon material generates less heat, less wear and longer life compared to non-coated stators. The diamond-like carbon material coating on metallic rotors also provides similar benefits. In general, such coatings add extreme hardness, excellent adhesion, high lubricity low friction and low erosion. A desired coating deposition usually has certain surface finish and cleanliness requirements to ensure coating adhesion. The high content diamond-like-carbon material coatings have high atomic deposition in the range of about 0.009 Ra to 0.018 Ra and thus can negate the need for post processing of the coating layer. Such coatings also generally can be deposited without any or substantial pre-processing.

Figure 2:
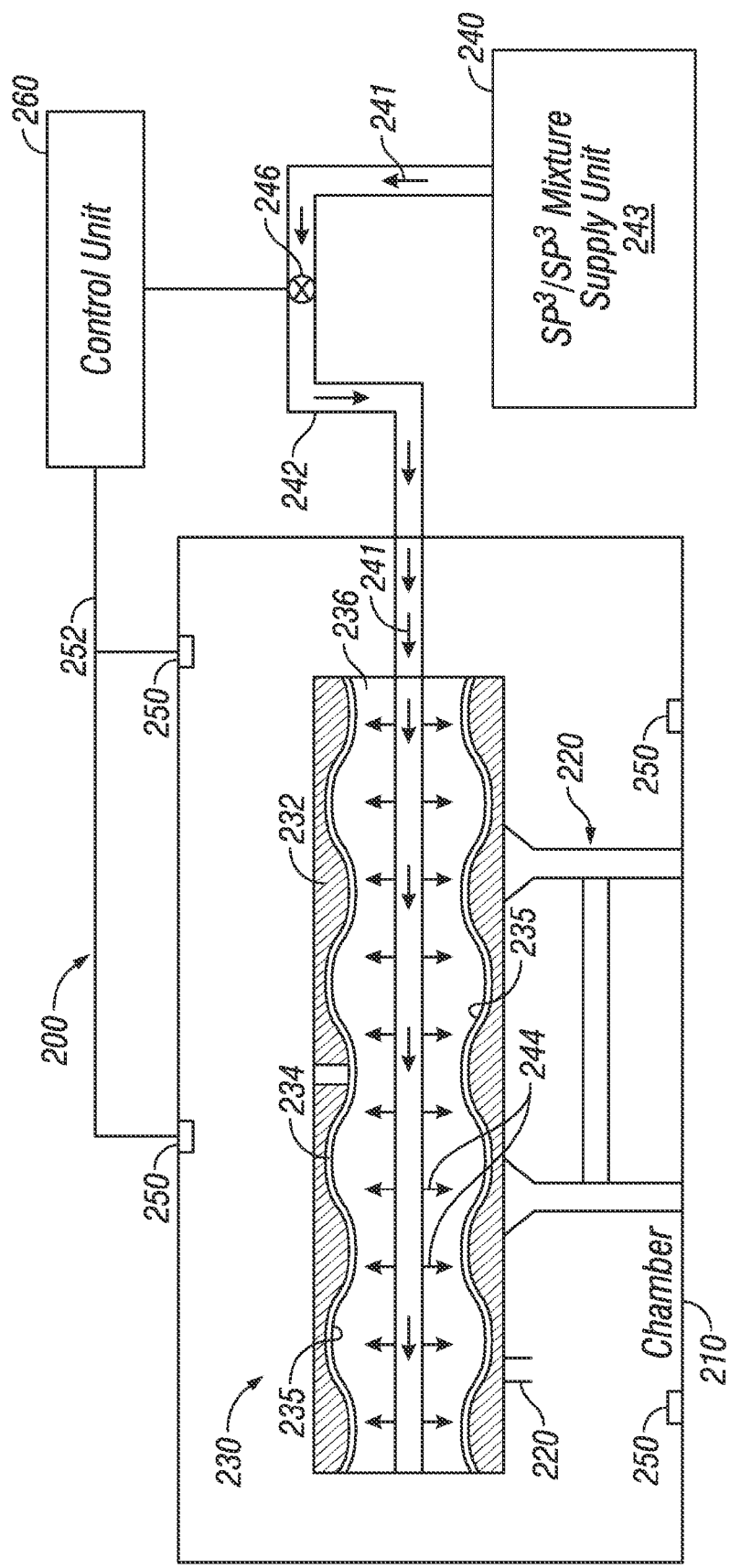
FIG. 2 shows an exemplary apparatus for coating a stator with a diamond-like carbon material according to on embodiment of the disclosure.

FIG. 2 shows an exemplary vapor deposition system 200 that may be utilized for applying relatively thick coatings (such as greater than 30 microns) of high content diamond-like carbon materials, such as SP3 bond carbon, on downhole components, such as stators and rotors, at temperatures lower than the downhole temperatures. The system 200 includes a vapor deposition chamber 210 that includes a suitable station 220 for placement of a component 230 to be deposited with the diamond-like carbon material, such as a high content SP3 bond carbon material. FIG. 2 shows, as an example, an exemplary stator as the component 230 placed on the station 220. The stator 230 includes a metallic housing 232 and an inner elastomeric layer 234. The stator 230 has a bore 236 therethrough. The system 200 further includes a supply unit 240 configured to supply precursor gas 241 to the chamber 210 via a line 242. In one aspect, the precursor gas vapors 241 may be applied to the inside 235 of the elastomeric layer 234 of the stator 230 via vapor outlets 244 in vapor supply line 242 extending through the stator bore 236. In aspects, the stator may be configured to rotate around the supply line 242 or the supply line may be configured to rotate inside the stator bore 236. The system of depositing vapors 241 on the stator is merely an example of vapor deposition method. Any other vapor deposition method or mechanism may be utilized for the purposes of this disclosure. The vapor deposition chamber 210 may include a heating system for controlling the heat in the chamber 210. One or more temperature sensors, such as sensor 250, may be utilized to monitor the temperature of the vapor deposition chamber 210. The system 200 further may include a control unit or controller 260 for controlling the operation of the system 200. In aspects, the controller 260 may be a computer-based unit that includes a processor, such as a microprocessor, data storage device, such a memory device and programs accessible to the processor for controlling the operation of the system 200. To coat the stator inside 235, precursor gas vapors 241 are supplied to the stator inside via the supply line 242 and openings 244. The controller 260 may control the vapor 241 supply by controlling a fluid flow control device 246 (such as a valve) in the supply line 242. The controller 260 may control the temperature of the vapor deposition chamber 210 in response to the temperature measurement signals provided by the sensors 250 to the controller 260 via communication line 252. A rotor outside may also be coated with the high content diamond-like carbon material in a system similar to system 200, wherein the coating is deposited on the rotor outside.

The foregoing description is directed to particular embodiments for the purpose of illustration and explanation. It will be apparent, however, to persons skilled in the art that many modifications and changes to the embodiments set forth above may be made without departing from the scope and spirit of the concepts and embodiments disclosed herein. It is intended that the following claims be interpreted to embrace all such modifications and changes.

The invention claimed is:

1. A method of making a drilling motor, comprising:
providing a stator having a bore therethrough defining an inner surface of the stator, wherein the inner surface of the stator comprises an elastomeric material;
extending a vapor supply line having vapor outlets through the bore;
supplying a diamond-like carbon material from the vapor supply line to the inner surface of the stator via the vapor outlets to applying a coating of the diamond-like carbon material to the elastomeric material on the inner surface of the stator; and
placing a rotor inside the stator to form the drilling motor.

2. The method of claim 1, wherein the stator is a metallic stator.

3. The method of claim 1, wherein the outer surface of the rotor is one of a metallic surface and an elastomeric surface.

4. The method of claim 1, wherein the diamond-like carbon material coating contains about 99 percent SP3 bond carbon.

5. The method of claim 1, wherein coating the elastomeric material on the inner surface of the stator comprises using a chemical vapor deposition process.

6. The method of claim 5, wherein the chemical vapor deposition method deposits the diamond-like material between 100 and 200 degrees Celsius.

7. The method of claim 1, wherein a thickness of the coating of diamond-like coating is at least 20 microns.

8. The method of claim 1, wherein a thickness of the coating of diamond-like material is between 30 microns and 100 microns.

9. The method of claim 1, further comprising one of: (i) rotating the stator around the vapor supply line; and (ii) rotating the vapor supply line within the stator.

10. The method of claim 1, further comprising providing the stator in a vapor deposition chamber and controlling a temperature of the vapor deposition chamber.

* * * * *